US010375819B2

(12) United States Patent
Toda et al.

(10) Patent No.: US 10,375,819 B2
(45) Date of Patent: Aug. 6, 2019

(54) CIRCUIT BOARD DEVICE

(71) Applicant: LAPIS Semiconductor Co., Ltd., Yokohama (JP)

(72) Inventors: Kentaro Toda, Yokohama (JP); Kenji Arai, Yokohama (JP); Manabu Miyazawa, Yokohama (JP); Kenichiro Nagatomo, Yokohama (JP); Touru Ueno, Yokohama (JP); Tsuguto Maruko, Yokohama (JP); Hirofumi Ogawa, Yokohama (JP); Tetsuo Oomori, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/900,484

(22) Filed: Feb. 20, 2018

(65) Prior Publication Data
US 2018/0242444 A1    Aug. 23, 2018

(30) Foreign Application Priority Data

Feb. 21, 2017  (JP) .................................. 2017-30537

(51) Int. Cl.
*H05K 1/02*    (2006.01)
*H05K 1/11*    (2006.01)
*H05K 1/18*    (2006.01)

(52) U.S. Cl.
CPC .......... *H05K 1/0216* (2013.01); *H05K 1/0231* (2013.01); *H05K 1/114* (2013.01); *H05K 1/115* (2013.01); *H05K 1/181* (2013.01); *H05K 2201/09227* (2013.01); *H05K 2201/09236* (2013.01); *H05K 2201/10015* (2013.01); *H05K 2201/10689* (2013.01)

(58) Field of Classification Search
CPC ...... H05K 1/0216; H05K 1/115; H05K 1/181; H05K 2201/09236
USPC ......................................................... 361/783
See application file for complete search history.

(56) References Cited

U.S. PATENT DOCUMENTS

| 2007/0177364 | A1* | 8/2007 | Larsen ................. | H05K 1/0231 361/760 |
| 2013/0279135 | A1* | 10/2013 | Isono .................. | H05K 1/0243 361/774 |
| 2015/0237731 | A1* | 8/2015 | Toyama ............... | H05K 1/0231 361/760 |

FOREIGN PATENT DOCUMENTS

| JP | 2001-203434 A | 7/2001 |
| JP | 2009-027140 A | 2/2009 |

* cited by examiner

*Primary Examiner* — Michael P McFadden
(74) *Attorney, Agent, or Firm* — Rabin & Berdo, P.C.

(57) ABSTRACT

A circuit board device includes: a printed wiring board; an IC chip provided on an obverse surface of the board and having at least one ground terminal; and a wiring pattern, disposed on the board, for providing a ground potential to the ground terminal of the IC chip. The wiring pattern is disposed on a reverse surface of the printed wiring board. The circuit board device has at least one via that is connected to the wiring pattern and passes through the printed wiring board at a position within a region where the IC chip is mounted on the obverse surface of the printed wiring board.

13 Claims, 4 Drawing Sheets

CIRCUIT BOARD DEVICE

BACKGROUND OF THE INVENTION

1. Field of the Invention

The present invention relates to a circuit board device.

2. Description of the Related Art

Circuit board devices equipped with semiconductor integrated circuits (referred to as IC chips) have been known in the art. Japanese Patent Application Laid-Open No. 2009-027140, for example, proposes a circuit board device designed to reduce electromagnetic interference (EMI) due to common mode noise generated from a power supply and a ground terminal of an IC chip. In such a circuit board device, a power supply terminal and the ground terminal of the IC chip are connected to a conductor pattern through capacitors. There is described that, the conductor pattern is connected to a plane conductor connected neither to a ground plane nor to a power supply plane through a filter, thereby such a configuration relatively reduces common mode noise flowing through the power supply and the ground of a printed wiring board to be an antenna in the Japanese Patent Application Laid-Open No. 2009-027140.

Japanese Patent Application Laid-Open No. 2001-203434 proposes a printed wiring board designed to suppress unwanted electromagnetic radiation generated from circuit patterns formed in a power supply layer and a ground layer. Such unwanted electromagnetic radiation is similar to the EMI in Japanese Patent Application Laid-Open No. 2009-027140. Japanese Patent Application Laid-Open No. 2001-203434 describes that unwanted electromagnetic radiation can be suppressed by connecting a bypass capacitor having a resonant frequency approximately the same as a resonant frequency f of the printed wiring board itself equipped with no electronic components such as IC chips between the power supply layer and the ground layer of the printed wiring board.

SUMMARY OF THE INVENTION

In the circuit board device described in Japanese Patent Application Laid-Open Publication No. 2009-027140, however, a loop of a power supplying wiring pattern and a ground wiring pattern, which may be subjected to electromagnetic induction externally, is present on a surface of the printed wiring board. Thus, if such a loop is subjected to the electromagnetic induction by external noise (such as electromagnetic waves or electromagnetic susceptibility (EMS), etc.), electromotive current is generated, thereby varying the power supply voltage of the IC chip. While various ways to reduce electromagnetic induction have been devised in the design of IC chips or large scale integration (LSI) chips mounted in electronic devices, sufficient noise tolerance has not been achieved in the conventional circuit board devices.

The present invention has been made in view of the above-described problem. It is an object of the present invention to provide a circuit board device that can reduce the entering of external noise.

According to one aspect of the present invention, a circuit board device includes: a printed wiring board; an IC chip provided on an obverse surface of the printed wiring board and having at least one ground terminal and at least one power supply terminal; and a ground wiring pattern and a power supplying wiring pattern provided on the printed wiring board for providing a ground potential and a power supply potential to the ground terminal and the power supply terminal of the IC chip, respectively. The ground wiring pattern is provided on a reverse surface of the printed wiring board. At least one via that is connected to the ground wiring pattern and passes through the printed wiring board is present in a region where the IC chip is mounted on the obverse surface of the printed wiring board.

DETAILED DESCRIPTION OF THE INVENTION

Figure 1:
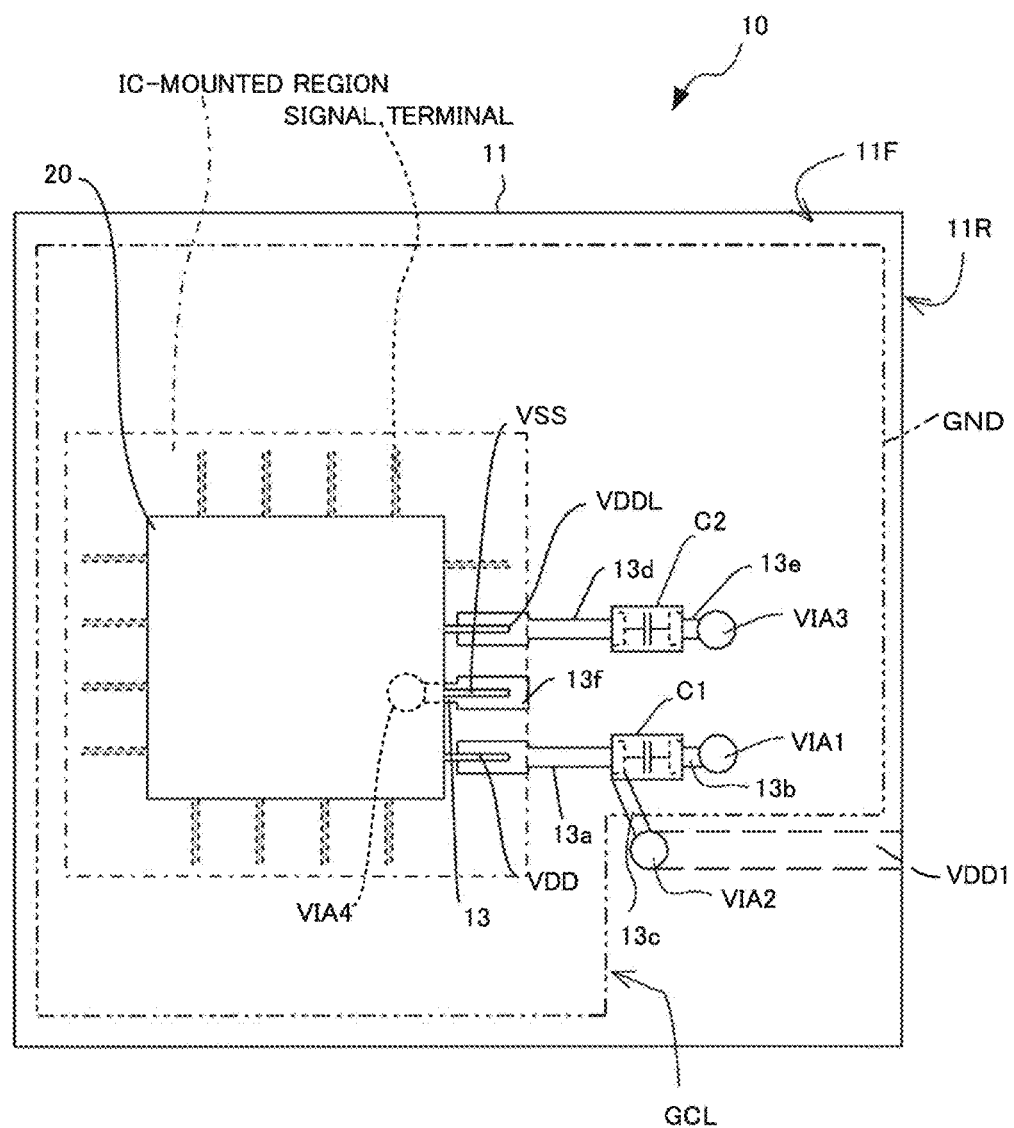
FIG. 1 is a schematic plan view illustrating part of a circuit board device according to a first embodiment.

Circuit board devices according to embodiments of the present invention will now be described below in detail with reference to the drawings. In those Examples, components having substantially the same function and configuration will be denoted by the same reference numerals, and redundant description will be omitted.

First Embodiment

FIG. 1 is a schematic plan view illustrating part of a circuit board device 10 of the present embodiment. Further, a printed wiring board 11 of the circuit board device 10 includes printed wirings such as signal wiring patterns, indeed, the printed wirings for signal wiring, however, are omitted in FIG. 1, for the sake of convenience. Still further, a description will be made with reference to a case where the printed wiring board 11 is a single-layer board having an obverse surface configured as a surface on which an IC chip is provided and a reverse surface configured as a ground layer GND.

In the circuit board device 10, an IC chip 20 is provided on an obverse surface 11F of the printed wiring board 11 as shown in FIG. 1. In this case, a description will be made with reference to a case where the IC chip 20 is packaged with quad flat package (QFP). Such an IC chip includes all ICs having external connection terminals two-dimensionally arranged in an array, such as ball grid array (BGA) ICs and pin grid array (PGA) ICs.

The IC chip 20 has a first power supply terminal VDD, a second power supply terminal VDDL, and a third power supply terminal VSS. The first power supply terminal VDD and the second power supply terminal VDDL each are a plus power supply terminal of an FET circuit in the IC chip 20 and a drain-side power supply terminal of an N-channel FET. The third power supply terminal VSS is a minus power supply terminal of an FET circuit in the IC chip 20. The third power supply terminal VSS is a ground terminal in the case of the one-side (single) power supply system and serves also as a source-side terminal of an N-channel FET. The IC 20 also includes a plurality of connection terminals such as signal terminals (indicated by broken lines).

The ground layer GND on a reverse surface 11R of the printed wiring board 11, which is opposite to the obverse surface 11F, is provided uniformly (i.e., solidly) on the reverse surface 11R excluding part thereof. In addition, a ground wiring pattern (not shown) connected to the ground layer GND on the reverse surface 11R may be provided on the obverse surface 11F of the printed wiring board 11.

The first power supply terminal VDD of the IC chip 20 is connected to a pad of a wiring pattern (hereinafter referred to simply as a conductor) 13a on one end side on the obverse surface 11F of the printed wiring board 11. A pad of the conductor 13a on the other end side is connected to one end of a bypass capacitor C1 on the power supply terminal side. One end of the bypass capacitor C1 on the ground side is connected to a pad of a conductor 13b on one end side. The other end of the conductor 13b is connected to a via VIA1. The via VIA1 passes through the printed wiring board 11 to be connected to the ground layer GND on the reverse surface 11R.

The one end of the bypass capacitor C1 on the power supply terminal side (conductor 13a) is connected to a conductor 13c on the obverse surface 11F of the printed wiring board 11 and connected to a via VIA2 through the conductor 13c. The via VIA2 passes through the printed wiring board 11 to be connected to a power supplying wiring pattern VDD1 provided on the reverse surface 11R. On the reverse surface 11R of the printed wiring board 11, the ground layer GND is provided with a cutout region GCL so as to separate the ground layer GND from the power supplying wiring pattern VDD1.

The second power supply terminal VDDL of the IC chip 20 is connected to a pad of a conductor 13d on one end side on the obverse surface 11F of the printed wiring board 11. A pad of the conductor 13d on the other end side is connected to one end of a bypass capacitor C2 on the power supply terminal side. One end of the bypass capacitor C2 on the ground side is connected to a pad of a conductor 13e on one end side. The other end of the conductor 13e is connected to a via VIA3. The via VIA3 passes through the printed wiring board 11 to be connected to the ground layer GND on the reverse surface 11R.

The bypass capacitors C1 and C2 of the first power supply terminal VDD and the second power supply terminal VDDL are disposed as close as possible to the power supply terminals.

The third power supply terminal VSS of the IC chip 20 is connected to a pad of a conductor 13f on one end side on the obverse surface 11F of the printed wiring board 11. The other end of the conductor 13f is connected to a via VIA4 under the IC chip 20. The via VIA4 passes through the printed wiring board 11 to be connected to the ground layer GND on the reverse surface 11R. The presence of the via VIA4 in a region where the IC chip 20 is mounted on the obverse surface 11F of the printed wiring board 11 can prevent the entering of noise, such as electromagnetic waves, from the obverse surface 11F side. The ground layer GND disposed on the reverse surface 11R of the printed wiring board provides ground potential to the third power supply terminal VSS of the IC chip 20, i.e., the ground terminal, through the via VIA4, which is a ground via. In addition, the vias VIA1 and VIA3, which are ground vias, also provide a ground potential to the ground side of the bypass capacitors C1 and C2.

Moreover, a ground wiring pattern, i.e., the conductor 13f, extending from the ground via VIA4, which is disposed below the IC chip 20, on the obverse surface 11F side of the printed wiring board 11 to the third power supply terminal VSS, which is the ground terminal, is also present in the region where the IC chip 20 is mounted. This can prevent the entering of noise, such as electromagnetic waves, from the obverse surface 11F side.

Furthermore, no third power supply terminal VSS of the IC chip 20 is connected to the ground vias VIA1 and VIA3 with the ground wiring pattern provided on the obverse surface 11F of the printed wiring board 11. This can prevent the entering of noise from such unconnected portions.

Second Embodiment

Figure 2:
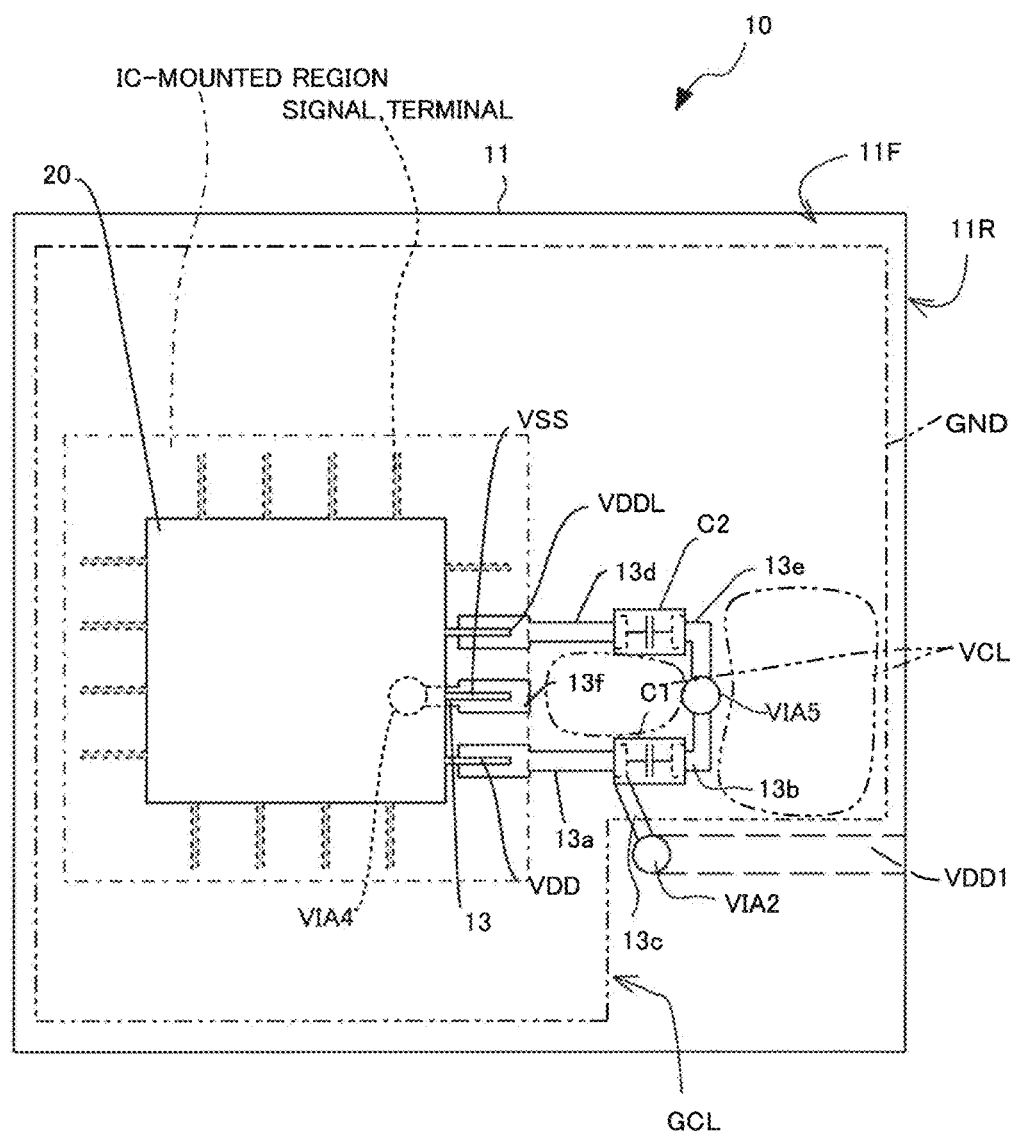
FIG. 2 is a schematic plan view illustrating part of a circuit board device according to a second embodiment.

FIG. 2 is a schematic plan view illustrating part of a circuit board device 10 according to a second embodiment.

Figure 3:
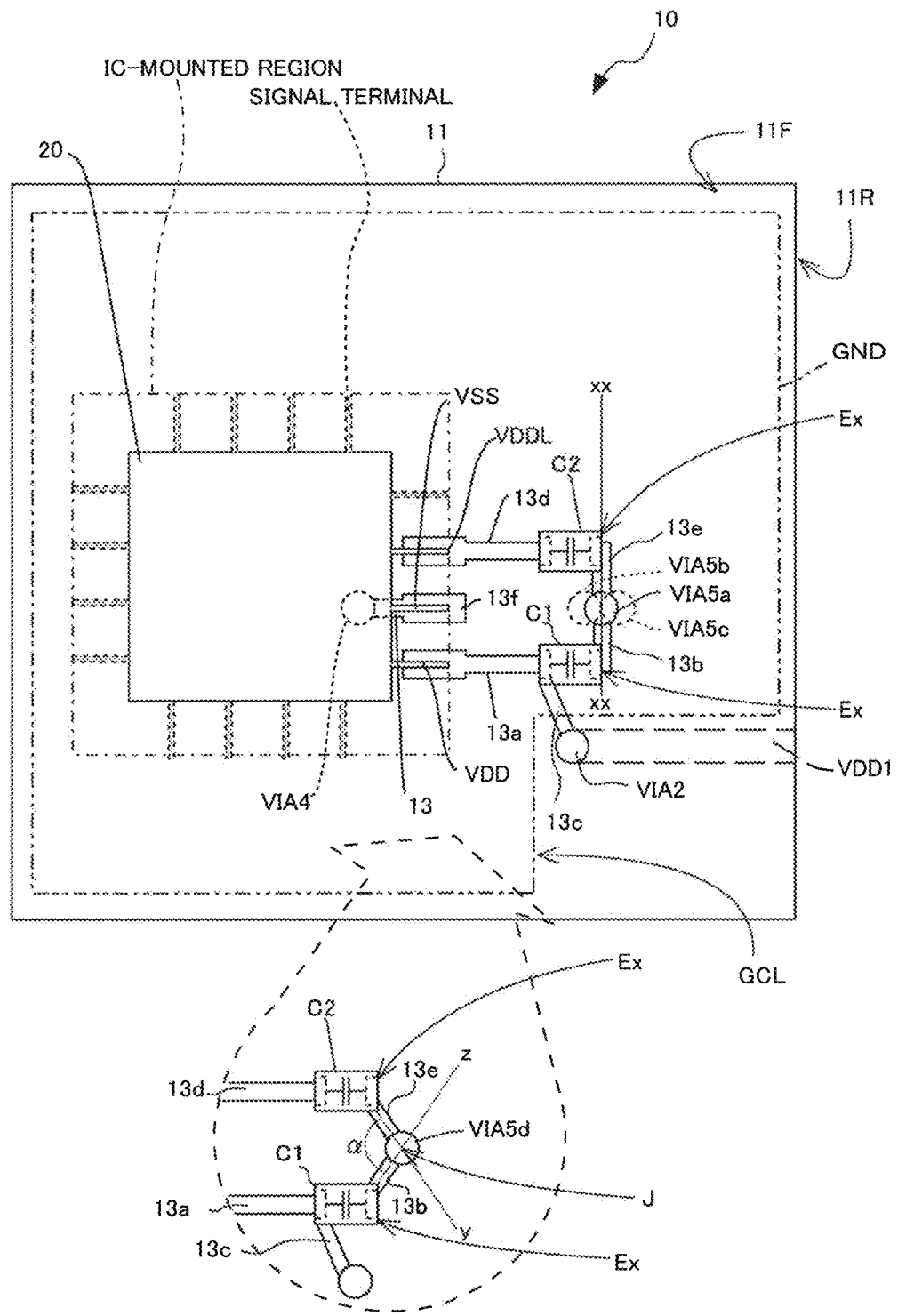
FIG. 3 is a schematic plan view illustrating partially-modified examples of the circuit board device of the second embodiment.

As shown in FIG. 2, the second embodiment has the same configuration as the first embodiment except that conductors 13b and 13e on the ground side of the bypass capacitors C1 and C2 are connected to a single common ground via VIA5 (which passes through a printed wiring board 11 to be connected to a ground layer GND on a reverse surface 11R) instead of the ground vias VIA1 and VIA3 of the first embodiment shown in FIG. 1. More specifically, the ground via VIA5 is disposed at a position intersecting with a straight line (not shown) connecting between one ends of the pair of bypass capacitors C1 and C2 on the ground side, and the conductors 13b and 13e are disposed while being connected to the common ground via VIA5. Among the ground via VIA5, and the conductors 13b and 13e, the ground via VIA5 is extended to a position farthest from the IC chip 20, and the conductors 13b and 13e are disposed closer to the IC chip 20 than the ground via VIA5 is. These ground via VIA5 and conductors 13b and 13e together form a ground wiring pattern loop. Alternatively, as shown in FIG. 3, for example, the conductors 13b and 13e may be formed in such a manner that the other ends Ex of the pair of bypass capacitors C1 and C2 in the IC chip 20 are connected to a common ground via VIA5a and the ground via VIA5a intersects with or is in contact with (ground via VIA5b or VIA5c) a straight line xx-xx connecting to the other ends (ground side) Ex of the pair of bypass capacitors C1 and C2. In this manner, a ground wiring pattern loop can be formed. Furthermore, as shown in a dashed arrow in FIG. 3, the wiring conductors 13b and 13e and a common ground via VIA5d may be configured in such a manner that an angle α is made by two planes y and z including a central axis J of the ground via VIA5d and the other ends Ex of the bypass capacitors C1 and C2 respectively so as to face the IC chip 20 with a predetermined angle of 90 degrees or more and 180 degrees or less, for example. Here, the conductors 13b and 13e may be connected to the bypass capacitors C1 and C2 in a curvilinear manner with the angle α, which is made by the conductors 13b and 13e and the ground via VIA5, having the aforementioned predetermined angle. Also in the present embodiment, no third power supply terminal VSS of the IC chip 20 is connected to the ground via VIA5 with the ground wiring pattern provided on the obverse surface 11F of the printed wiring board 11. This can prevent the entering of noise from such unconnected portion.

Furthermore, the wiring conductors on a surface layer of the third power supply terminal VSS are made independently, i.e., no connection is made between the conductors 13b and 13e and other wiring conductors except that the conductors 13b and 13e are used to connect the bypass capacitors C1 and C2 and the ground via VIA5. Consequently, even if a ground wiring pattern (not shown) is present, the entering of noise from such a ground wiring pattern can be prevented from occurring.

As shown in FIG. 2, the printed wiring board 11 may be configured to have wiring absent regions VCLs provided so as to separate the common ground via VIA5 from conductors such as the signal lines and the ground wiring pattern and interpose the bypass capacitors C1 and C2 and the via VIA5 therebetween.

(Magnetic Field Noise Irradiation Test)

Specifically, a magnetic field noise irradiation test was conducted on printed wiring boards with a noise simulator in order to confirm the effects of the wiring absent regions VCLs. In the magnetic field noise irradiation test, an apparatus for generating high-voltage impulse noise is employed, a loop antenna is connected to the apparatus to generate a magnetic field, and the magnetic field is irradiated onto a printed board. Resistance against such an impulse noise voltage is then measured.

Figure 4:
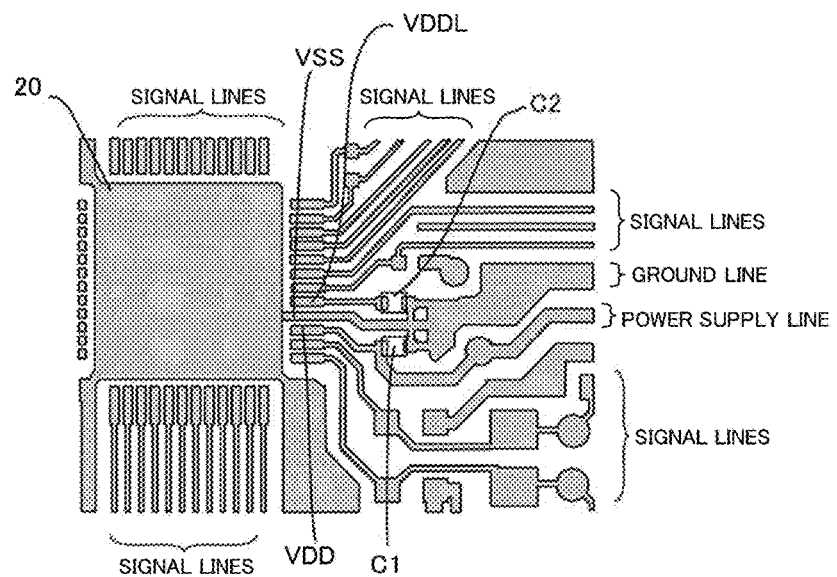
FIG. 4 is a plan view illustrating part of a printed board according to Comparative Example having no wiring absent regions of the second embodiment.
Figure 5:
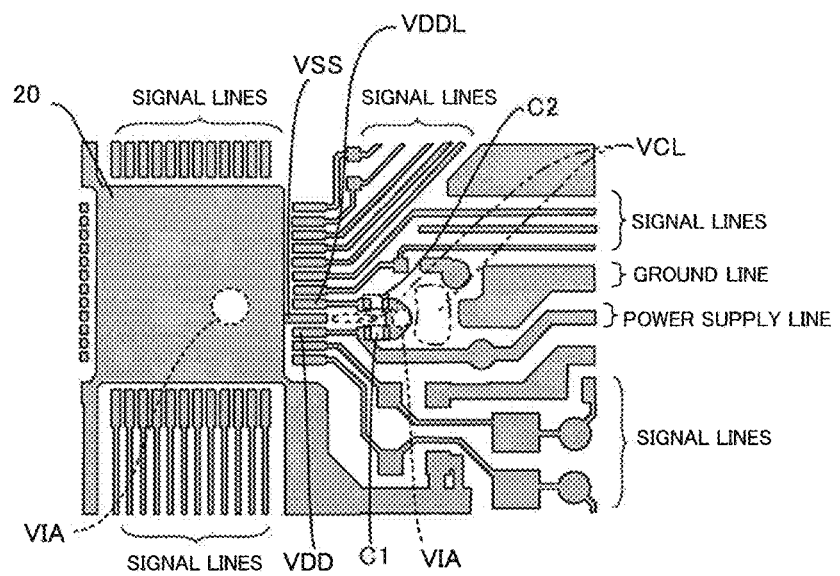
FIG. 5 is a plan view illustrating part of a printed board having the wiring absent regions of the second embodiment.

FIG. 4 is a plan view illustrating part of a printed wiring board having no wiring absent regions VCLs (Comparative Example). FIG. 5 is a plan view illustrating part of a printed wiring board having the wiring absent regions VCLs.

The results of the magnetic field noise irradiation test showed that the conventional printed wiring board having no wiring absent regions VCLs, which is shown in FIG. 4, has a withstanding voltage of about 800 V but the printed wiring board having the wiring absent regions VCLs, which is shown in FIG. 5, has a withstanding voltage of 2000 V or more.

According to the present embodiment, the wiring absent regions VCLs are disposed so as to surround part of the power supply-ground loop of the bypass capacitors connected to the power supply terminals of the IC chip. This can separate the power supply-ground loop from the outer periphery of an opening formed by the wiring absent region VCL, thus suppressing the influence of externally-received noise. Consequently, the influence of the externally-received noise can be reduced.

According to the circuit board devices of the above-described embodiments, a large part of the ground wiring pattern loop from the power supply terminal, which is making a turn, is provided on a surface different from the obverse surface of the circuit board device (in the cross section of the printed wiring board). This can reduce the occurrence of electromotive current due to the electromagnetic induction. Thus, as compared to a case where the bypass capacitors are simply mounted on the obverse surface of the circuit board device, electromotive current due to external electromagnetic waves (noise) can be reduced, thus preventing the false operation of an LSI or an IC. Moreover, in addition to the bypass capacitors, the same applies also to booster capacitors in switching regulators and phase compensating capacitors in linear regulators. Furthermore, the present invention is useful also when wiring conductors configured to make a loop among a plurality of terminals of an LSI are required in a crystal oscillator or a filter, for example.

While an end of each via is provided with a connection pad and the via is connected to a bypass capacitor through the connection pad and the wiring conductor in the above-described embodiments, the present invention is not limited thereto. For example, vias may be directly connected to various surface-mounted components such as connection terminals or bypass capacitors.

This application claims the benefit of foreign priority to Japanese Patent Application No. 2017-030537, filed Feb. 21, 2017, which is incorporated by reference in its entirety.

What is claimed is:

1. A circuit board device comprising:
a printed wiring board;
an IC chip provided on an obverse surface of the printed wiring board and having at least one ground terminal and at least first and second power supply terminals, the ground terminal and the first and second power supply terminals extending outward from the IC chip in a first direction, the ground terminal arranged between the first and second power supply terminals in a second direction crossing the first direction;
a ground wiring pattern and a power supplying wiring pattern provided on the printed wiring board, the ground wiring pattern and the power supplying wiring pattern being configured to provide a ground potential and a power supply potential to the ground terminal and the power supply terminal of the IC chip, respectively, wherein the ground wiring pattern is provided on a reverse surface of the printed wiring board;
a ground via extending through the printed wiring board from the obverse surface to the reverse surface;
a bypass capacitor that is provided on the obverse surface of the printed wiring board, the bypass capacitor having one end connected to the first power supply terminal and another end connected to the ground via;
at least one via that is connected to the ground wiring pattern and passes through the printed wiring board is present in a region where the IC chip is mounted on the obverse surface of the printed wiring board,
a first wiring pattern connected between the ground terminal and the at least one via, the first wiring pattern extending in a third direction opposite the first direction between the ground terminal outward of the IC and the at least one via in the region where the IC chip is mounted.

2. The circuit board device according to claim 1, wherein the power supplying wiring pattern is connected to the one end of the bypass capacitor that is connected to the power supply terminal.

3. A circuit board device comprising:
a printed wiring board;
an IC chip provided on an obverse surface of the printed wiring board and having at least one ground terminal and a plurality of power supply terminals, the at least one ground terminal and the plurality of power supply terminals extending outward from the IC chip in a first direction, the ground terminal arranged between the plurality of power supply terminals in a second direction crossing the first direction;
a ground wiring pattern and a power supplying wiring pattern provided on the printed wiring board, the ground wiring pattern and the power supplying wiring pattern being configured to provide a ground potential and a power supply potential to the ground terminal and the power supply terminals of the IC chip, respectively;
a single common ground via extending through the printed wiring board from the obverse surface to a reverse surface; and
bypass capacitors that are provided on the obverse surface of the printed wiring board, each of the bypass capacitors having one end connected to each of the power supply terminals and another end connected to the common ground via, wherein
a straight line extending in the second direction between the other ends of the bypass capacitors on the obverse surface of the printed wiring board passes through the common ground via in a plan view.

4. The circuit board device according to claim 3, wherein
the ground wiring pattern is provided on the reverse surface of the printed wiring board, and
at least one via that is connected to the ground wiring pattern and passes through the printed wiring board is present in a region where the IC chip is mounted on the obverse surface of the printed wiring board.

5. The circuit board device according to claim 3, further comprising a conductor extending from the at least one via in the first direction to connect the at least one via to the ground terminal, wherein a first portion of the conductor is disposed below the IC chip on the obverse surface of the printed wiring board, and a second portion of the conductor extends outward from the IC chip in the plan view to connect to the ground terminal.

6. The circuit board device according to claim 3, further comprising wiring absent regions provided so as to separate the common ground via from conductors on the printed wiring board and interpose the common ground via therebetween.

7. A circuit board device comprising:
a printed wiring board;
an IC chip provided on an obverse surface of the printed wiring board and having at least one ground terminal and a plurality of power supply terminals, the at least one ground terminal and the plurality of power supply terminals extending outward from the IC chip in a first direction, the ground terminal arranged between the plurality of power supply terminals in a second direction crossing the first direction;
a ground wiring pattern and a power supplying wiring pattern provided on the printed wiring board, the ground wiring pattern and the power supplying wiring pattern being configured to provide a ground potential and a power supply potential to the ground terminal and the power supply terminals of the IC chip, respectively;
a single common ground via provided on the obverse surface of the printed wiring board; and
bypass capacitors that are provided on the obverse surface of the printed wiring board, each of the bypass capacitors having one end connected to a respective one of the power supply terminals and another end connected to the common ground via, wherein
the common ground via is placed in such a manner that an angle is made by two planes including a central axis of the common ground via and the other ends of the bypass capacitors respectively so as to face the IC chip with a predetermined angle on the obverse surface of the printed wiring board, the predetermined angle being between ninety degrees and one hundred eighty degrees, and
the common ground via is arranged between the bypass capacitors in the second direction.

8. The circuit board device according to claim 7, wherein
the ground wiring pattern is provided on a reverse surface of the printed wiring board, and
at least one via that is connected to the ground wiring pattern and passes through the printed wiring board is present in a region where the IC chip is mounted on the obverse surface of the printed wiring board.

9. The circuit board device according to claim 7, further comprising a conductor extending in the first direction from the at least one via to the ground terminal, wherein a first portion of the conductor is disposed below the IC chip on the obverse surface of the printed wiring board and a second portion of the conductor is located outward of the IC chip in a plan view to connect to the ground terminal.

10. The circuit board device according to claim 7, further comprising wiring absent regions provided so as to separate the common ground via from conductors on the printed wiring board and interpose the common ground via therebetween.

11. The circuit board device according to claim 1, further comprising a conductor that is provided on the obverse surface of the printed wiring board, extends outward from the IC chip in the first direction, and connects the power supply terminal to the one end of the bypass capacitor.

12. The circuit board device according to claim 3, further comprising conductors each of which is provided on the obverse surface of the printed wiring board, extends outward from the IC chip in the first direction, and connects each of the power supply terminals to the one end of a respective one of the bypass capacitors.

13. The circuit board device according to claim 7, further comprising conductors each of which is provided on the obverse surface of the printed wiring board, extends outward from the IC chip in the first direction, and connects each of the power supply terminals to the one end of a respective one of the bypass capacitors.

* * * * *